US008450770B2

(12) United States Patent
Jeong et al.

(10) Patent No.: US 8,450,770 B2
(45) Date of Patent: May 28, 2013

(54) LIGHT EMITTING PACKAGE STRUCTURE

(75) Inventors: Hyunsoo Jeong, Kyunggi-Do (KR);
Seongoo Lee, Kyunggi-Do (KR);
Ryungshik Park, Kyunggi-Do (KR);
Hyunil Lee, Kyunggi-Do (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 258 days.

(21) Appl. No.: 12/777,525

(22) Filed: May 11, 2010

(65) Prior Publication Data
US 2011/0278610 A1    Nov. 17, 2011

(51) Int. Cl.
H01L 27/15 (2006.01)
H01L 29/267 (2006.01)
H01L 31/12 (2006.01)
H01L 33/00 (2010.01)
H01L 21/00 (2006.01)

(52) U.S. Cl.
USPC ............... 257/100; 257/81; 257/434; 257/98; 257/99; 257/433; 438/26; 438/29; 438/33; 438/116; 438/127

(58) Field of Classification Search
USPC .................. 438/26, 29, 33, 116, 127; 257/81, 257/98, 99, 100, 433, 434, 795
See application file for complete search history.

(56) References Cited

U.S. PATENT DOCUMENTS

| 5,278,451 | A * | 1/1994 | Adachi et al. ................. 257/790 |
| 5,959,316 | A * | 9/1999 | Lowery ............................ 257/98 |
| 6,717,355 | B2 * | 4/2004 | Takahashi et al. ............ 313/503 |
| 7,573,190 | B2 * | 8/2009 | Hirosaki et al. .............. 313/503 |
| 2002/0021085 | A1 * | 2/2002 | Ng .................................. 313/499 |
| 2003/0122482 | A1 * | 7/2003 | Yamanaka et al. ............ 313/512 |
| 2004/0217693 | A1 * | 11/2004 | Duggal et al. ................. 313/504 |
| 2005/0227569 | A1 * | 10/2005 | Maeda et al. .................... 445/25 |
| 2007/0194341 | A1 * | 8/2007 | Chang et al. ..................... 257/99 |
| 2008/0297047 | A1 * | 12/2008 | Kohno et al. .................. 313/512 |
| 2010/0112734 | A1 * | 5/2010 | Koizumi et al. ................ 438/27 |
| 2010/0200874 | A1 * | 8/2010 | Shioi et al. ....................... 257/91 |

FOREIGN PATENT DOCUMENTS

| CN | 102263184 | 11/2011 |
| WO | WO2009/031495 | * 3/2009 |

OTHER PUBLICATIONS

"First Office Action of China Counterpart Application", issued on Jun. 4, 2012, p. 1-p. 5, in which the listed reference was cited.

* cited by examiner

Primary Examiner — Fernando L Toledo
Assistant Examiner — Karen Kusumakar
(74) Attorney, Agent, or Firm — J.C. Patents

(57) ABSTRACT

A light emitting diode (LED) package structure comprising a carrier, an LED chip, a first encapsulant, at least one bonding wire, a plurality of phosphor particles and a second encapsulant is provided. The LED chip is disposed on the carrier. The LED chip has at least one electrode. The first encapsulant is disposed on the carrier and covering the LED chip. The first encapsulant is provided with at least one preformed opening exposing at least a portion of the at least one electrode. The at least one bonding wire is electrically connected between the at least one electrode and the carrier via the at least one preformed opening. The phosphor particles are distributed within the first encapsulant. The second encapsulant is disposed on the carrier and encapsulates the LED chip, the first encapsulant and the at least one bonding wire.

17 Claims, 12 Drawing Sheets

US 8,450,770 B2

LIGHT EMITTING PACKAGE STRUCTURE

BACKGROUND OF THE INVENTION

1. Field of the Invention

The present invention generally relates to a structure and a fabricating method of a light source. More particularly, the present invention relates to a package structure and a package process of light emitting diode (LED).

2. Description of Related Art

Light emitting diodes (LEDs) have replaced fluorescent lamps and incandescent lamps in some fields, for example, lamps of scanners requiring for quick response, lamps of projection apparatus, backlight sources or front light sources of liquid crystal displays (LCDs), illumination for dashboards of automobiles, traffic lights, common illumination devices, etc. Compared with conventional lamps, the LEDs have absolute advantages, for example, small volume, long lifespan, low driving voltage/current, non-fragile, mercury free (no pollution), and good luminous efficiency (power saving).

FIG. 1 is a cross-sectional view showing a conventional white LED package structure. As shown in FIG. 1, in the conventional white LED package structure 100, an LED chip 110 is bonded to a bottom surface 122a of a cavity 122 of a carrier 120. A part of lights 152 emitted from the LED chip 110 is converted via phosphor particles 130 distributed in a resin 140, so as to output white lights 154. However, chromatic aberration (e.g. yellowish) occurs since the lengths of light paths (e.g. L1, L2) in the resin 140 corresponding to different emergence angles (e.g. θ1, θ2) from the LED chip 110 are varied. Accordingly, luminance of the white LED package structure 100 is reduced, and color of the light output is not uniform.

Besides, the prior art further provides another LED package structure having a phosphor coating layer formed by wafer level fabrication, wherein the phosphor coating layer conformally and fully covers the LED chip and the carrier so as to output a uniform white light. Nonetheless, the fabrication cost of the phosphor coating layer goes high due to performing a wafer level coating process.

SUMMARY OF THE INVENTION

Accordingly, the present invention is directed to an LED package structure capable of providing uniform light output and having high illuminating efficiency and low fabrication cost.

The present invention is directed to an LED package structure, wherein a thin-layered encapsulant mixed with the phosphor particles can be obtained, and the quality of light output can be improved.

The present invention is directed to a package process for forming the aforementioned LED package structure.

As embodied and broadly described herein, the present invention provides an LED package structure comprising a carrier, an LED chip, a first encapsulant, at least one bonding wire, a plurality of phosphor particles and a second encapsulant. The LED chip is disposed on the carrier. The LED chip has at least one electrode. The first encapsulant is disposed on the carrier and covering the LED chip. The first encapsulant is provided with at least one preformed opening exposing at least a portion of the at least one electrode. The at least one bonding wire is electrically connected between the at least one electrode and the carrier via the at least one preformed opening. The phosphor particles are distributed within the first encapsulant. The second encapsulant is disposed on the carrier and encapsulates the LED chip, the first encapsulant and the at least one bonding wire.

The present invention further provides an LED package process comprising: disposing a plurality of LED chips on a substrate, each of the LED chips having at least one electrode; forming at least one sacrifice bump on the at least one electrode of each of the LED chips; forming a first encapsulant on the substrate to cover the LED chips and the at least one sacrifice bumps on each of the LED chips, wherein the first encapsulant is mixed with a plurality of phosphor particles; thinning the first encapsulant from a top side of the first encapsulant to expose a top portion of the at least one sacrifice bump on each of the LED chips; etching the at least one sacrifice bump on each of the LED chips to form an opening in the first encapsulant, the opening exposing at least a portion of the at least one electrode of each of the LED chips; performing a singulation process to separate the LED chips from one another to obtain a plurality of LED units; bonding one of the LED units to a carrier and electrically connecting the at least one electrode of the LED chip of the LED unit to the carrier by at least one bonding wire via the opening; and, forming a second encapsulant on the carrier to encapsulate the LED unit and the at least one bonding wire.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
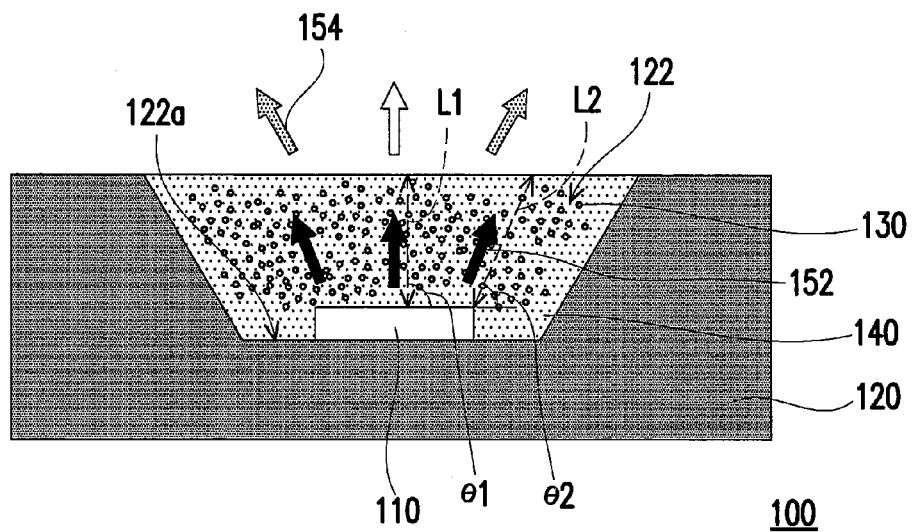
FIG. 1 is a cross-sectional view showing a conventional white LED package structure.

Reference will now be made in detail to the present preferred embodiments of the invention, examples of which are illustrated in the accompanying drawings. Wherever possible, the same reference numbers are used in the drawings and the description to refer to the same or like parts.

Figure 2:
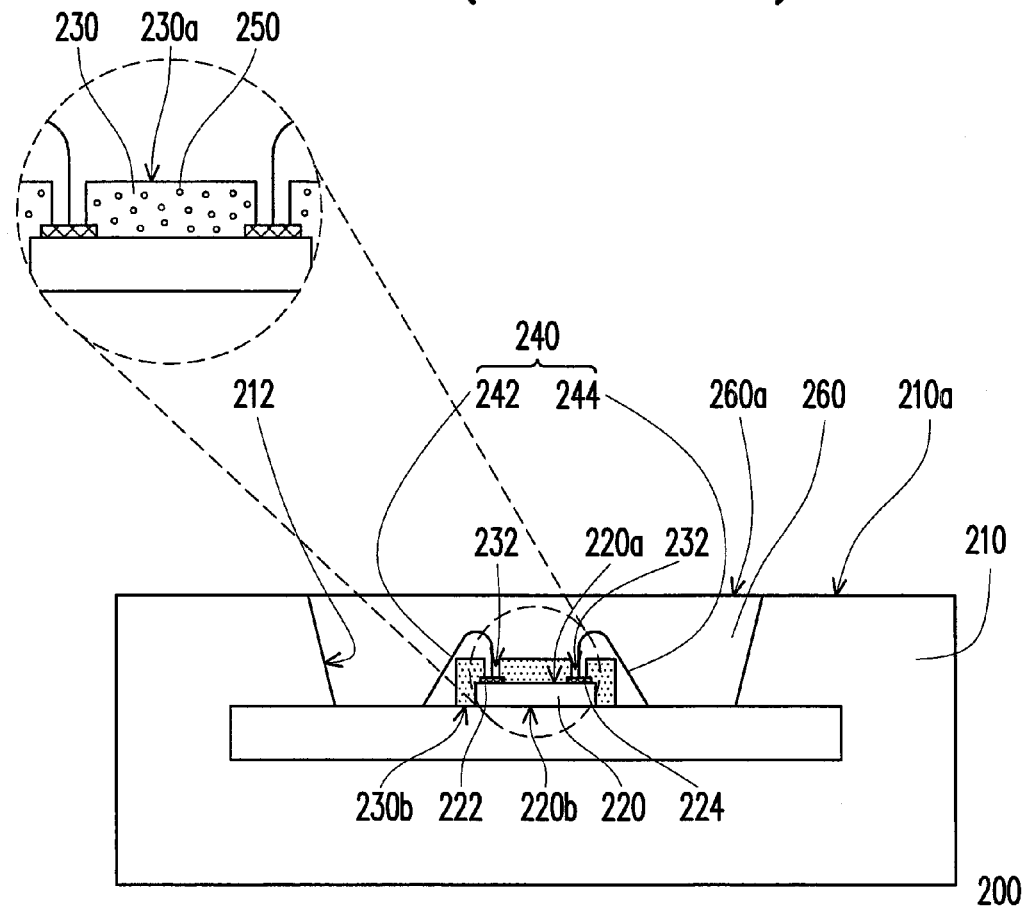
FIG. 2 is a cross-sectional view showing LED package structures according to an embodiment of the present invention.

FIG. 2 is a cross-sectional view showing an LED package structure according to an embodiment of the present invention. Referring to FIG. 2, the LED package structure 200 comprises a carrier 210, an LED chip 220, a first encapsulant 230, at least one bonding wire 240, a plurality of phosphor particles 250 and a second encapsulant 260. In the present embodiment, the carrier 210 is, for example, a pre-molded metal leadframe having a cavity 212. In other embodiments, the carrier 210 can further be, for example, a metal leadframe or a circuit substrate (e.g. a ceramic substrate), while the type of the carrier 210 of the present invention is not limited thereto.

The LED chip 220 is disposed on the carrier 210. The LED chip 220 can be bonded and electrically connected to the carrier 210 by wire bonding technique. Practically, the LED chip 220 has at least one electrode, and the connecting manner between the LED chip 220 and the carrier 210 depends on the number and deposition of electrode of the LED chip 220. For example, as shown in FIG. 2 of the present embodiment, the LED chip 220 has a first electrode 222, a second electrode 224 (or even more electrodes) both disposed on a top surface 220a of the LED chip 220, while the first electrode 222 and the second electrode 224 are respectively electrically connected to the carrier 210 via a first bonding wire 242 and a second bonding wire 244. However, in another embodiment not shown, an LED chip having a top electrode electrically connected to the carrier 210 via a bonding wire and a bottom electrode attached and electrically connected to the carrier 210 may be provided.

The first encapsulant 230 is disposed on the carrier 210 and covering the LED chip 220. More specifically, the first encapsulant 230 is provided with preformed openings 232 exposing at least a portion of the first electrode 222 and at least a portion of the second electrode 224. Since the openings 232 are preformed in the first encapsulant 230, the first bonding wire 242 and the second bonding wire 244 can be electrically connected between the first electrode 222 and the carrier 210 and between the second electrode 224 and the carrier 210 via their corresponding preformed openings 232, respectively.

Referring to FIG. 2, the top surface 230a of the first encapsulant 230 can be patterned or textured for enhancing light extraction efficiency of the LED package structure 200. The first encapsulant 230 can be made of transparent polymer or translucent polymer, such as soft gel, elastomer or resin, wherein the resin may be epoxy, silicone or epoxy-silicone hybrid resin. Furthermore, the first encapsulant 230 can be mixed with an organic filler or an inorganic filler. Herein, a material of the filler within the first encapsulant 230 can be selected from a group consisting of SiO2, TiO2, Al2O3, Y2O3, carbon black, sintered diamond powder, asbestos, glass, and a combination thereof.

The phosphor particles 250 are distributed within the first encapsulant 230. The first encapsulant 230 mixed with the phosphor particles 250 covers the LED chip 220 such that the light (e.g. blue light) emitted from the LED chip 230 can be converted to light in different color (e.g. green, yellow or red light) by the phosphor particles 250, and then the lights in different colors are mixed to generate a white light. Preferably, the first encapsulant 230 covers the entire LED chip 220 except the exposed portion of the first electrode 222, the exposed portion of the second electrode 224 and a bottom surface 220b of the LED chip 220 facing the carrier 210. In addition, the bottom surface 220b of the LED chip 220 is coplanar with a bottom surface 230b of the first encapsulant 230.

The phosphor particles 250 can be made of thermal-luminescent material or electro-luminescent material. More specifically, a material of the phosphor particles is elected from a group consisting of $(YGdTb)_3(AlGa)_5O_{12}$:Ce, $(SrBaCaMg)_2SiO_4$:Eu, $(Sr,Ba,CaMg)_3SiO_5$:Eu, $CaAlSiN_3$:Eu, $CaScO_4$:Ce, $Ca_{10}(PO_4)FCl$:SbMn, $M_5(PO_4)_3Cl$:Eu, $BaBg_2Al_{16}O_{27}$:Eu, Ba, $Mg_2Al_{16}O_{27}$:Eu, Mn, $3.5MgO.0.5MgF_2.GeO_2$:Mn, $Y_2O_2S$:Eu, $Mg_6As_2O_{11}$:Mn, $Sr_4Al_{14}O_{25}$:Eu, (Zn, Cd)S:Cu, $SrAl_2O_4$:Eu, $Ca_{10}(PO_4)_6ClBr$:Mn, Eu, $Zn_2GeO_4$:Mn, $Gd_2O_2S$:Eu, $La_2O_2S$:Eu, wherein M is an alkali earth metal selected from a group consisting of Sr, Ca, Ba, Mg, and a combination thereof.

The second encapsulant 260 is disposed on the carrier 210 and encapsulates the LED chip 220, the first encapsulant 230, the first bonding wire 242 and the second bonding wire 244. Herein, the second encapsulant 260 can be made of transparent polymer or translucent polymer, such as soft gel, elastomer or resin, wherein the resin may be epoxy, silicone or epoxy-silicone hybrid resin. Furthermore, the second encapsulant 260 may be mixed with an organic filler or an inorganic filler. A material of the filler within the encapsulant can be selected from a group consisting of SiO2, TiO2, Al2O3, Y2O3, carbon black, sintered diamond powder, asbestos, glass, and a combination thereof.

In the present embodiment, a pre-molded metal leadframe serving as the carrier 210 is adopted, so as to form the LED package structure 200, which is so-called a plastic leaded chip package carrier (PLCC) package structure. It is noted that the cavity 212 of the carrier 210 is filled with the second encapsulant 260, while a top surface 260a of the second encapsulant 260 is coplanar with a top surface 210a of the carrier 210 surrounding the cavity 212.

Figure 3:
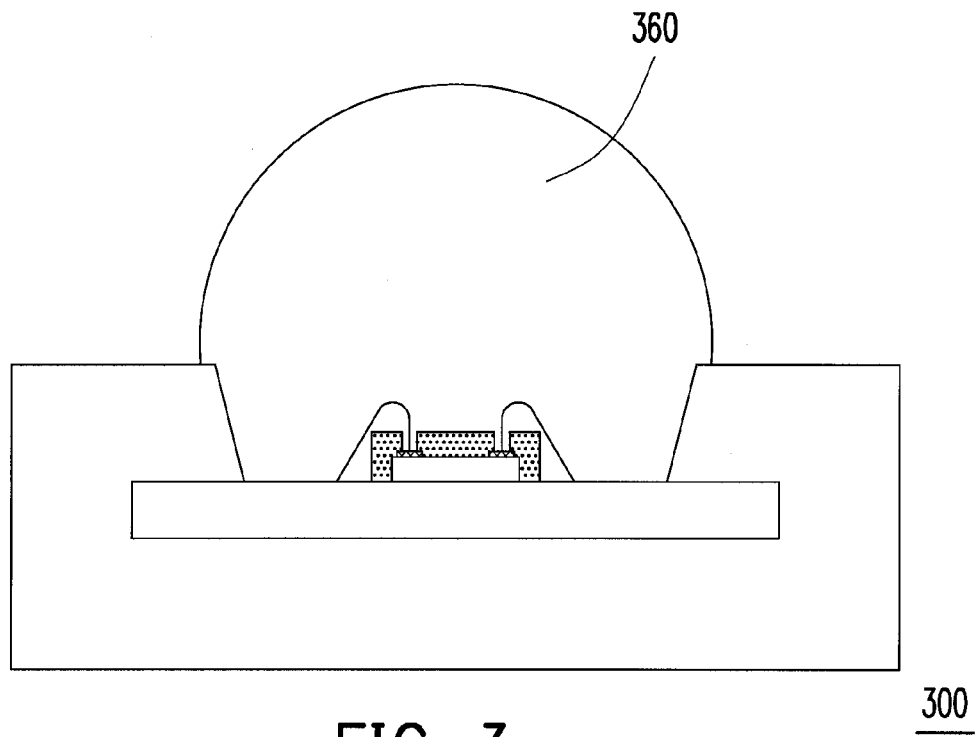
FIG. 3 is a cross-sectional view showing an LED package structure according to another embodiment of the present invention.
Figure 4:
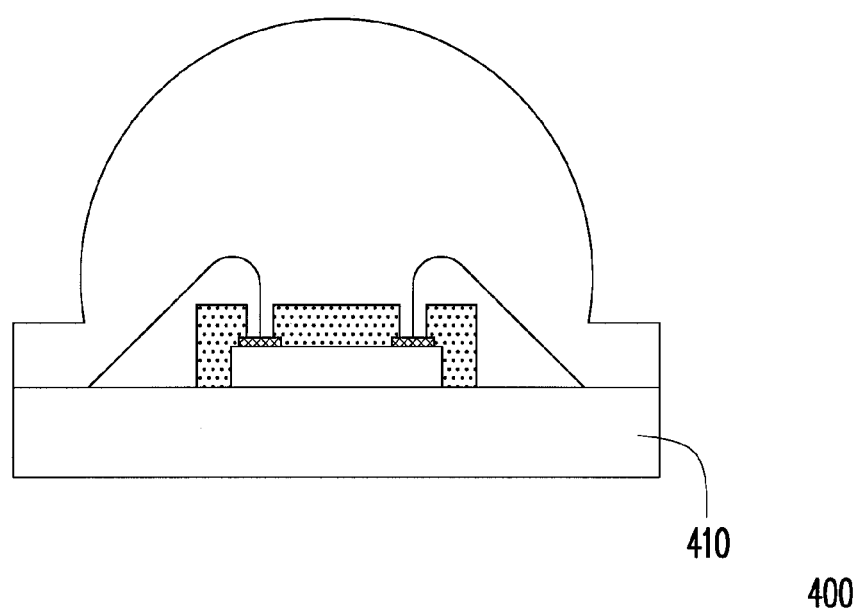
FIG. 4 is a cross-sectional view showing an LED package structure according to further another embodiment of the present invention.

However, various types of LED package structure are further proposed in other embodiments of the present invention by changing the profile of the encapsulant or adopting other types of carrier to form the LED package structure. FIG. 3 is a cross-sectional view showing an LED package structure according to another embodiment of the present invention. Referring to FIG. 3, the profile of the encapsulant 360 is in a convex lens shape so as to enhance light extraction efficiency of the LED package structure 300. FIG. 4 is a cross-sectional view showing an LED package structure according to further another embodiment of the present invention. As shown in FIG. 4, a ceramic substrate is adopted to serve as the carrier 410 and thereby forms the LED package structure 400.

Figure 5:
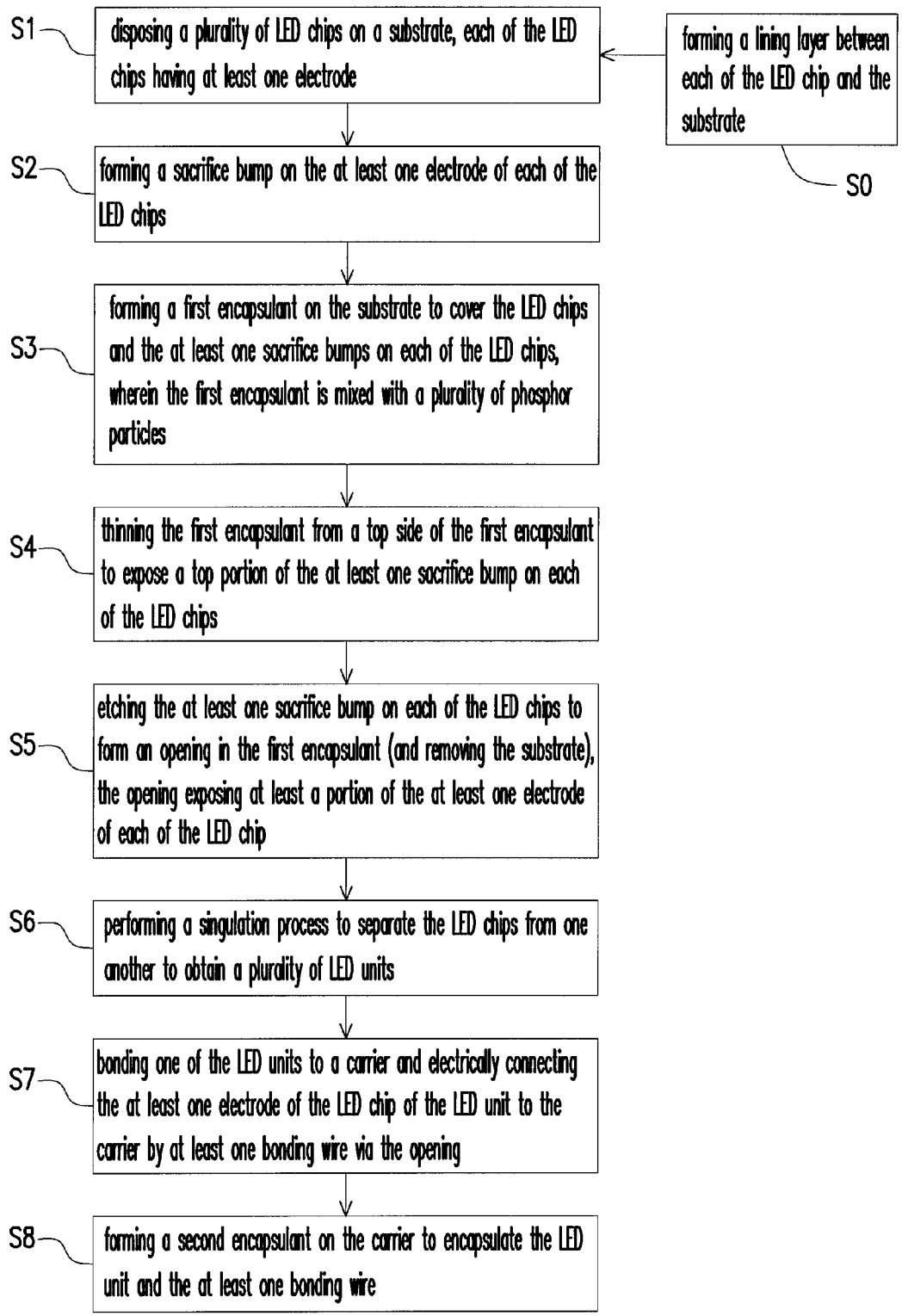
FIG. 5 is a flow chart illustrating a package process for fabricating the aforementioned LED package structures of FIGS. 2 through 4 according to an embodiment of the present invention.

A package process for fabricating the aforementioned LED package structures are also provided in the present invention. FIG. 5 is a flow chart illustrating an package process for fabricating the aforementioned LED package structures of FIGS. 2 through 4 according to an embodiment of the present invention. FIGS. 6A through 6H are cross-sectional views showing the LED package process of FIG. 5. Referring to FIG. 5 accompanying with FIGS. 6A through 6G, a wafer level process is conducted to form a plurality of LED units and then each of the LED units is packaged with a carrier to form an LED package structure (e.g. the aforementioned LED package structures 200, 300 or 400).

Figure 6A:
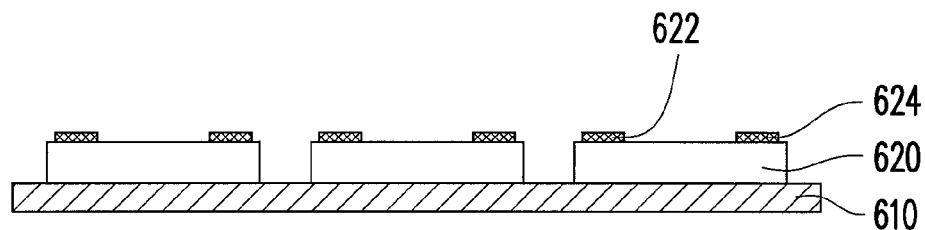
FIGS. 6A through 6H are cross-sectional views showing the LED package process of FIG. 5.

Firstly, referring to FIG. 6A, as illustrated in Step S1, a substrate 610 is provided and a plurality of LED chips 620 are disposed onto the substrate 610, wherein each of the LED chips 620 has at least one electrode, such as a first electrode 622 and a second electrode 624. Herein, the material of the substrate 610 may comprise acid-soluble metal (e.g., gold, palladium, copper, aluminium, iron, etc.) or metal alloy selected from a group consisting of copper, aluminum, tin, iron, and a combination thereof.

Figure 6B:
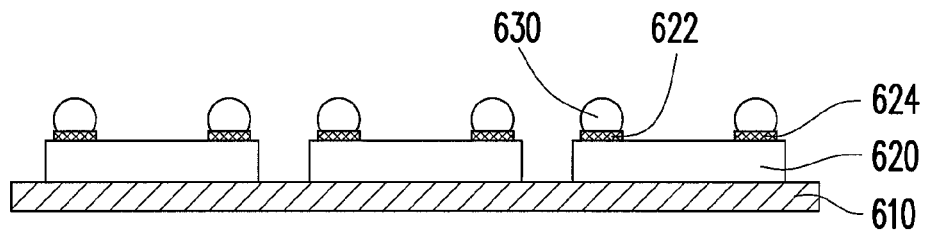

Then, referring to FIG. 6B, as illustrated in Step S2, a plurality of sacrifice bumps 630 are formed on the first electrode 622 and the second electrode 624 of each of the LED chips 620. Each of the sacrifice bumps 630 may be formed by one or more stub bump balls or formed by one or more solder bump balls. The sacrifice bumps 630 may be made of acid-soluble metal (e.g., gold, palladium, copper, aluminium, iron, etc.) or metal alloy selected from a group consisting of copper, aluminum, iron, nickel, lead, and a combination thereof.

Figure 6C:
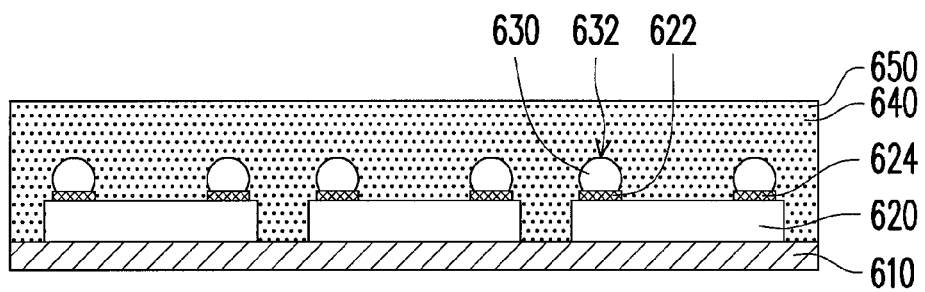

Next, referring to FIG. 6C, as illustrated in Step S3, a first encapsulant 640 is formed on the substrate 610 to cover the LED chips 620 and the sacrifice bumps 630 on each of the LED chips 620. The first encapsulant 640 is mixed with a plurality of phosphor particles 650. In addition, the first encapsulant 640 can be formed by dispensing, printing or molding.

Figure 6D:
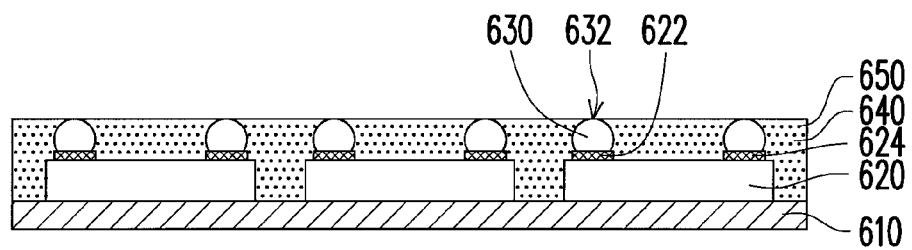

Then, referring to FIG. 6D, as illustrated in Step S4, the first encapsulant 640 is thinned from a top side thereof to expose a top portion 632 of each of the sacrifice bumps 630. The first encapsulant 640 may be thinned by such as grinding, chemical etching or slicing. In this Step, the thickness of the first encapsulant 640 can be finely controlled and a thin-layered first encapsulant 640 can be obtained so as to improve the quality of light output.

Figure 6E:
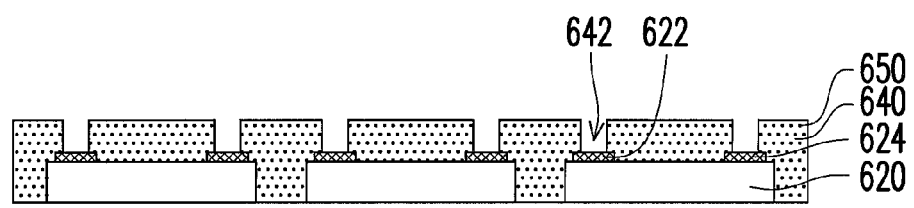

Next, referring to FIG. 6E, as illustrated in Step S5, the sacrifice bumps 630 are etched to remain a plurality of openings 642 in the first encapsulant 640. The openings 642 respectively expose at least a portion of the first electrode 622 and a portion of the second electrode 624 of each of the LED chips 620. In addition, the substrate 610 is also removed in Step S5, wherein the substrate 610 can be removed by etching, mechanical removing, or grinding. Preferably, the substrate 610 is removed by acid etching together with the sacrifice bumps 630 when the sacrifice bumps 630 and the substrate 610 are both made of acid-soluble material and can be etched at the same time.

Figure 6F:
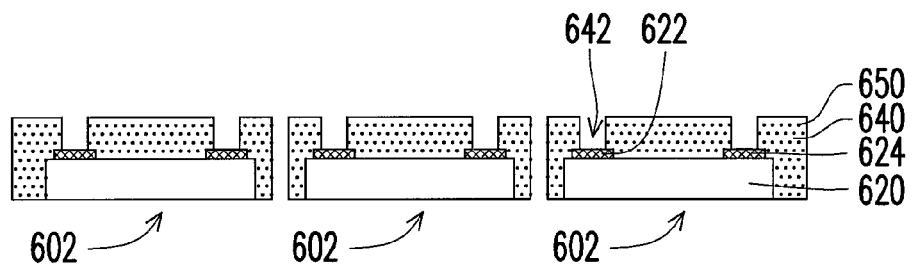

Then, referring to FIG. 6F, as illustrated in Step S6, a singulation process is performed to separate the LED chips 620 from one another to obtain a plurality of LED units 602. Specifically, the first encapsulant 640 between two adjacent LED chips 620 is sawed by a cutting tool (not shown).

Figure 6G:
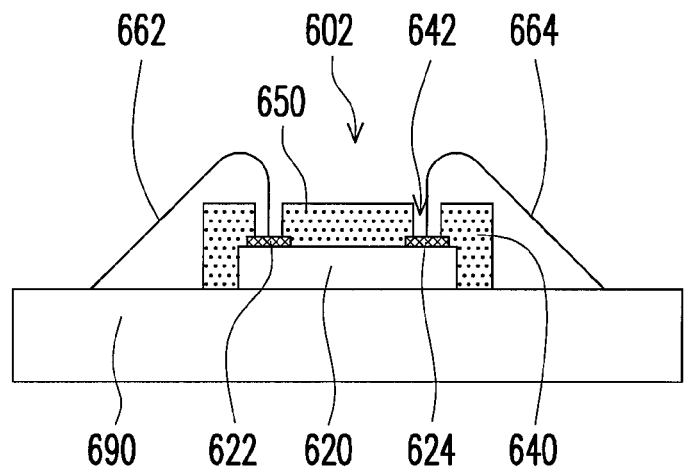

Next, referring to FIG. 6G, as illustrated in Step S7, the LED unit 602 is bonded to a carrier 690 and a wire bonding process is performed to electrically connect the LED chip 620 of the LED unit 602 to the carrier 690. Specifically, the first electrode 622 and the second electrode 624 of the LED chip 620 are electrically connected to the carrier 690 by a first bonding wire 662 and a second bonding wire 664 via the openings 642, respectively.

Figure 6H:
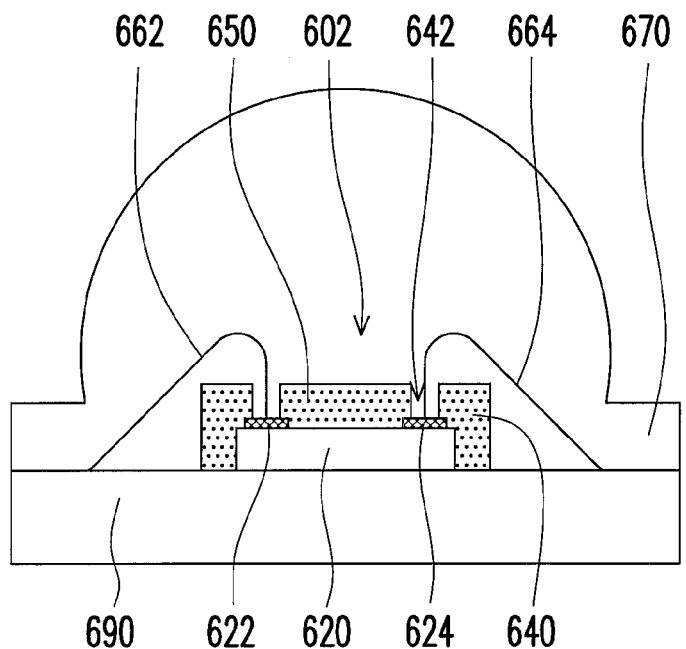

Then, referring to FIG. 6H, as illustrated in Step S8, a second encapsulant 670 is formed on the carrier 690 to encapsulate the LED unit 602, the first bonding wire 662 and the second bonding wire 664. The second encapsulant 670 can be formed by dispensing, printing or molding. For example, the second encapsulant 670 can be formed by dispensing or printing to form the second encapsulant 260 as shown in FIG. 2A or by molding to form the encapsulant 360 in convex lens shape as shown in FIG. 3.

The pre-molded metal leadframe has a cavity, which may be filled with polyphthalamide (PPA), epoxy molding compounding (EMC), or liquid crystal polymer (LCP) to act as a reflector. Therefore the light dispersion could be reduced and the luminous intensity is increased.

Figure 7A:
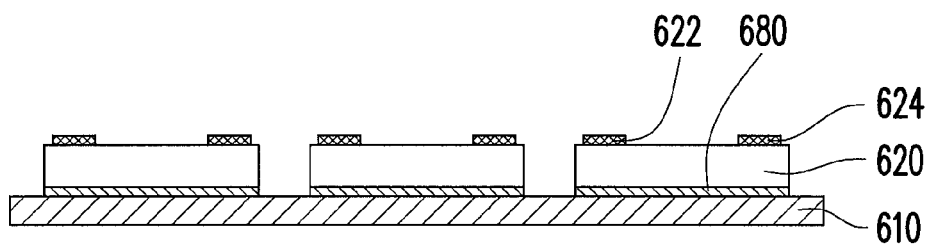
FIGS. 7A through 7H are cross-sectional views showing another LED package process according to another embodiment of the present invention.
Figure 7B:
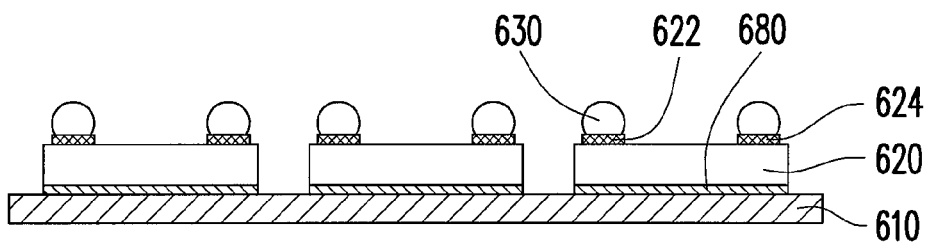
Figure 7C:
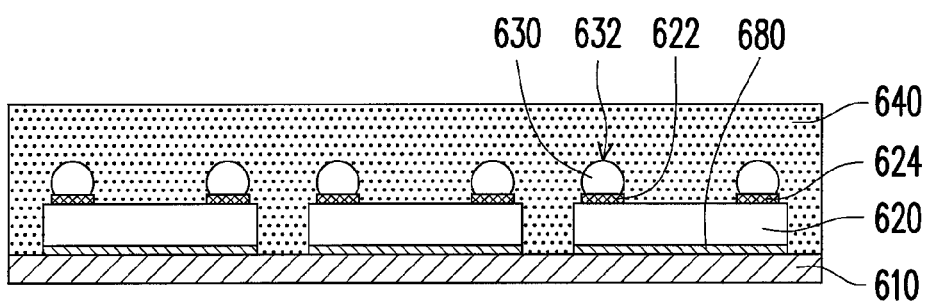
Figure 7D:
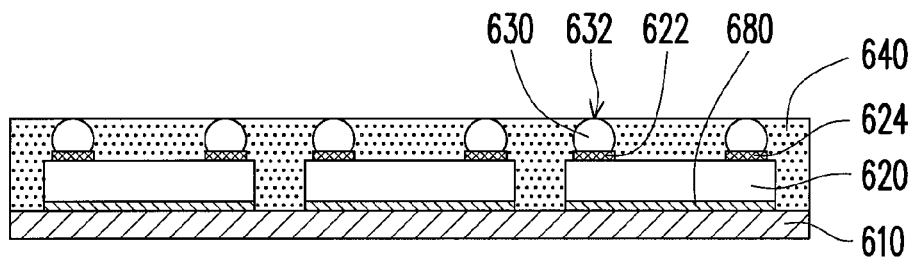
Figure 7E:
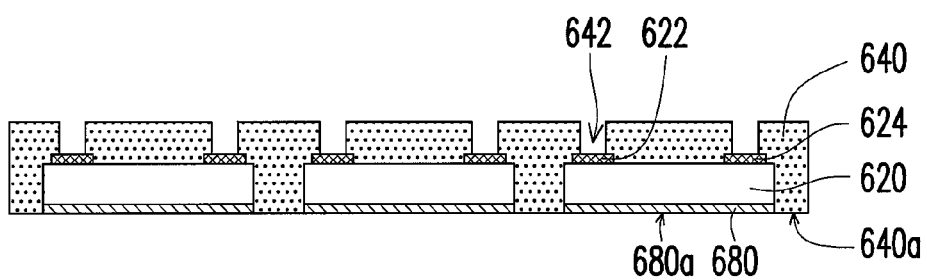
Figure 7F:
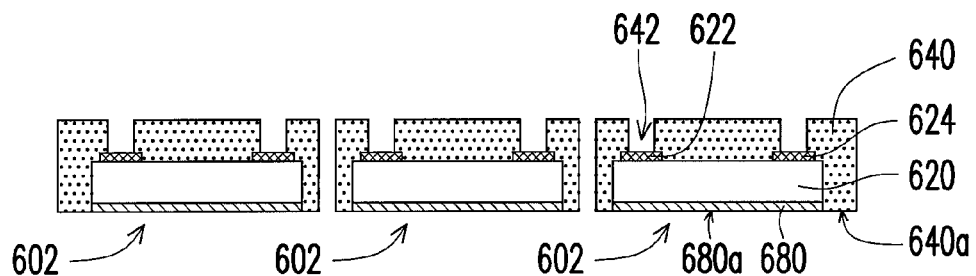
Figure 7G:
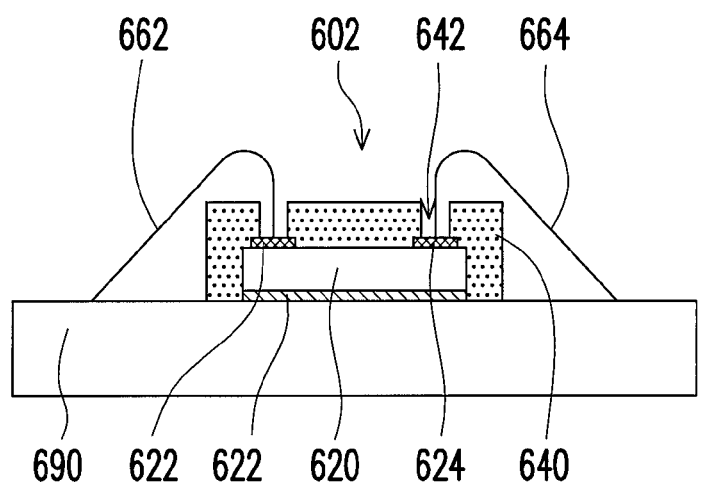
Figure 7H:
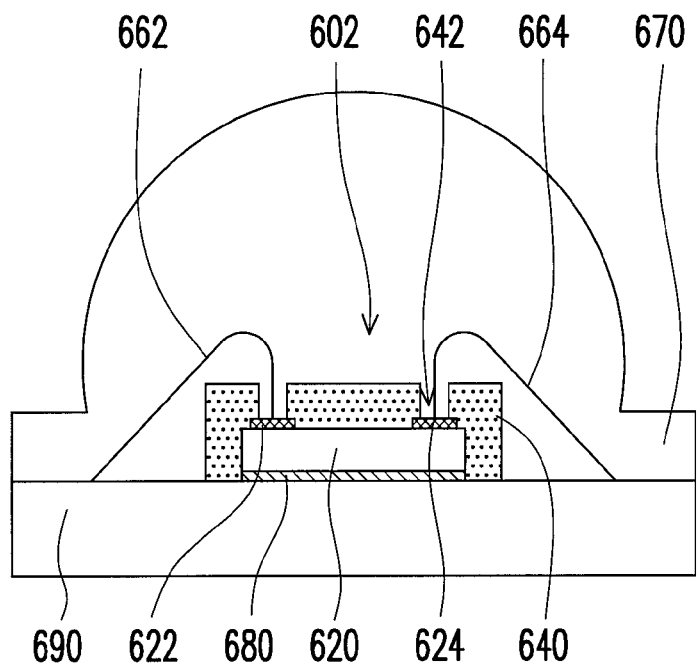

FIGS. 7A through 7H are cross-sectional views showing another LED package process according to another embodiment of the present invention. The package process of the present embodiment is similar to the above embodiment in FIGS. 6A through 6H except that a plurality of lining layers 680 are formed on the substrate 610 (Step S0) before disposing the LED chips 620 onto the substrate 610. Therefore, the LED chips 620 are separated from the substrate 610 as shown in FIG. 7A. In addition, referring to FIG. 7E, since the lining layers 680 are formed between the LED chips 620 and the substrate 610, a bottom surface 680a of each of the lining layers 680 is coplanar with a bottom surface 640a of the sequentially formed first encapsulant 640. In the present embodiment, the lining layer 680 can be an Au layer such that the sequentially formed LED unit 602 can be attached on the carrier 690 by adopting "eutectic bonding" technique.

Figure 8A:
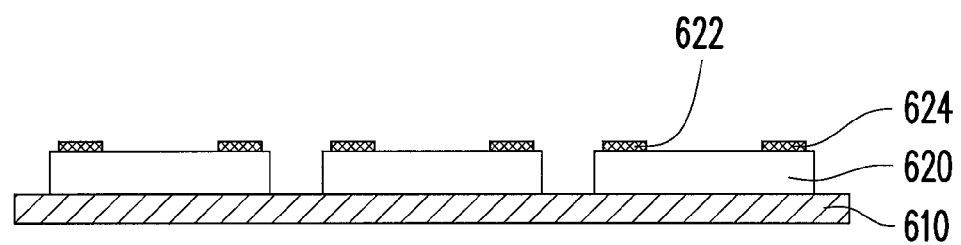
FIGS. 8A through 8H are cross-sectional views showing another LED package process according to further another embodiment of the present invention.
Figure 8B:
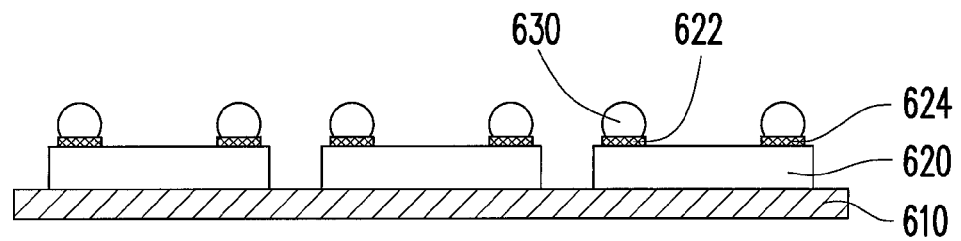
Figure 8C:
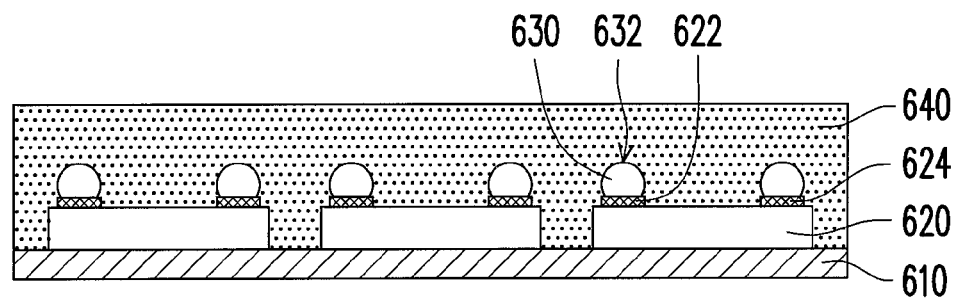
Figure 8D:
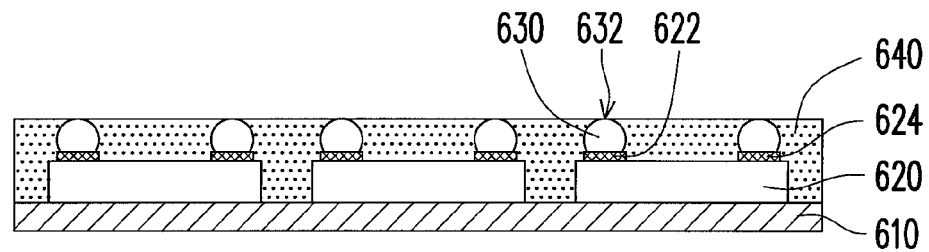
Figure 8E:
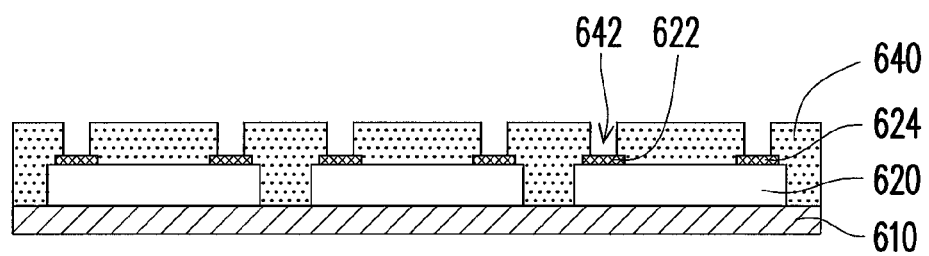
Figure 8F:
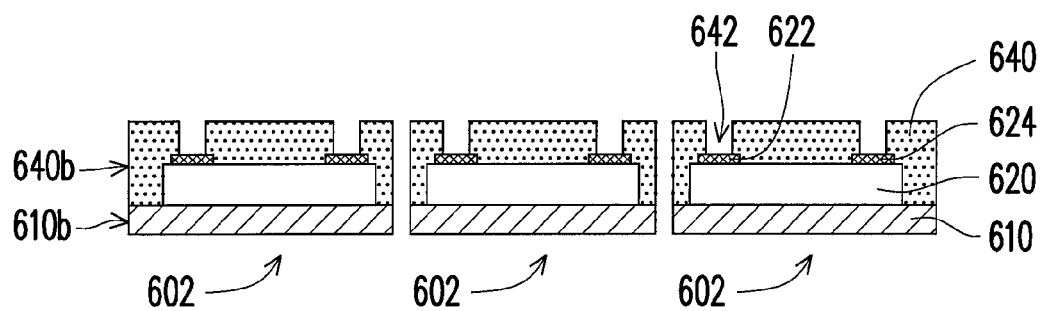
Figure 8G:
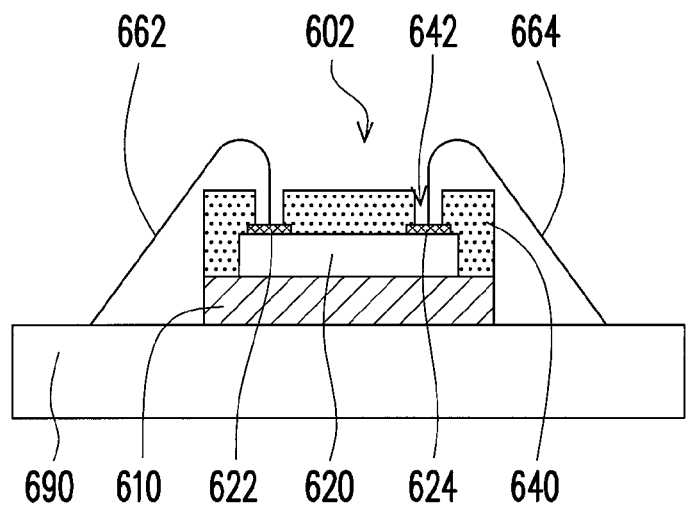
Figure 8H:
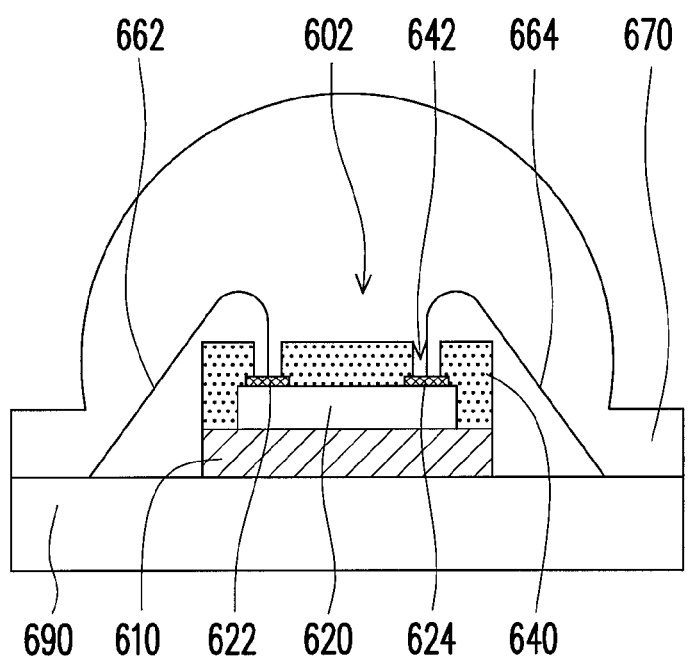

FIGS. 8A through 8H are cross-sectional views showing another LED package process according to further another embodiment of the present invention. The package process of the present embodiment is similar to the above embodiment in FIGS. 6A through 6H except that the substrate 610 is not removed in Step S5. Thereby, the single LED chip 620 as shown in FIG. 8F is obtained by sawing the substrate 610 together with the first encapsulant 640 in the singulation process of Step S6. In addition, referring to FIG. 8G, the LED unit 602 is bonded to the carrier 690 with the separation of the sawed substrate 610 therebetween. Furthermore, referring to FIG. 8F, since the substrate 610 is remained in Step S5, a side surface 640b of the first encapsulant 640 is vertically coplanar with a side surface 610b of the substrate 610 after performing the singulation process of Step S6.

Based on the above, the LED package structure is provided with a package level encapsulant mixed with the phosphor particles and having preformed openings for electrically connecting the LED chip to the carrier. Uniform light output and high illuminating efficiency can be obtained by the phosphor particles uniformly distributed in the junction coating. Besides, since the encapsulant mixed with the phosphor particles is formed in package level to cover the LED chip rather the entire carrier, the fabrication cost of the LED package structure can be reduced. Furthermore, since openings for electrically connecting the LED chip to the carrier are preformed in the encapsulant mixed with the phosphor particles, the thickness of the encapsulant can be finely controlled and a thin-layered encapsulant mixed with the phosphor particles can be obtained by the step of thinning the encapsulant, and thereby the quality of light output can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode (LED) package structure, comprising:
   a carrier;
   an LED chip disposed on the carrier, the LED chip having at least one electrode;
   a first encapsulant disposed on the carrier and covering the LED chip, the first encapsulant being provided with at least one opening exposing at least a portion of the at least one electrode;
   at least one bonding wire electrically connected between the at least one electrode and the carrier via the at least one opening, wherein the at least one bonding wire is located within the at least one opening and apart from the first encapsulant with a distance;
   a plurality of phosphor particles distributed within the first encapsulant; and
   a second encapsulant, disposed on the carrier and encapsulating the LED chip, the first encapsulant and the at least one bonding wire.

2. The LED package structure according to claim 1, wherein the first encapsulant covers the entire LED chip except the exposed portion of the at least one electrode and a bottom surface of the LED chip facing the carrier.

3. The LED package structure according to claim 1, wherein a bottom surface of the LED chip is coplanar with a bottom surface of the first encapsulant.

4. The LED package structure according to claim 1, wherein the carrier has a cavity accommodating the LED chip.

5. The LED package structure according to claim 4, wherein the cavity is filled with the second encapsulant, while a top surface of the second encapsulant is coplanar with a top surface of the carrier surrounding the cavity.

6. The LED package structure according to claim 1, wherein the carrier comprises a metal leadframe, a pre-molded metal leadframe or a circuit substrate.

7. The LED package structure according to claim 1, wherein the LED chip has a first electrode and a second electrode both disposed on a top surface of the LED chip, while the first electrode and the second electrode are respectively electrically connected to the carrier via a first bonding wire and a second bonding wire.

8. A light emitting diode (LED) package structure, comprising:
   a carrier;
   an LED chip disposed on the carrier and having at least one electrode;
   a first encapsulant provided with a plurality of phosphor particles therein and covering the LED chip, the first encapsulant having at least one opening exposing at least a portion of the at least one electrode;
   at least one bonding wire electrically connected between the at least one electrode and the carrier through the at least one opening, wherein the at least one bonding wire is located within the at least one opening and apart from the first encapsulant with a distance; and
   a second encapsulant covering the LED chip, the first encapsulant and the at least one bonding wire, wherein the at least one opening of the first encapsulant is filled with the second encapsulant.

9. The LED package structure according to claim 8, wherein the LED chip has a bottom surface facing the carrier, a top surface opposite to the bottom surface, and a plurality of side surfaces connected between the top surface and the bottom surface, the at least one electrode is disposed on the top surface, and the first encapsulant is formed on the top surface and the plurality of side surfaces of the LED chip.

10. The LED package structure according to claim 9, wherein the bottom surface of the LED chip is coplanar with a bottom surface of the first encapsulant.

11. The LED package structure according to claim 8, wherein the carrier has a cavity accommodating the LED chip.

12. The LED package structure according to claim 11, wherein the cavity is filled with the second encapsulant, while a top surface of the second encapsulant is coplanar with a top surface of the carrier surrounding the cavity.

13. The LED package structure according to claim 8, wherein the carrier comprises a metal leadframe, a pre-molded metal leadframe or a circuit substrate.

14. The LED package structure according to claim 9, wherein the LED chip has a first electrode and a second electrode both disposed on the top surface of the LED chip, while the first electrode and the second electrode are respectively electrically connected to the carrier via a first bonding wire and a second bonding wire.

15. A light emitting diode (LED) package structure, comprising:
   a carrier;
   an LED chip disposed on the carrier, the LED chip having opposing top and bottom surfaces and a plurality of side surfaces connected between the top surface and the bottom surface, the LED chip having at least one electrode on the top surface; and
   a first encapsulant disposed on the top surface and the side surfaces of the LED chip, the first encapsulant having at least one opening exposing the at least one electrode,
   at least one bonding wire electrically connected between the at least one electrode and the carrier via the at least one opening, wherein the at least one bonding wire is located within the at least one opening and apart from the first encapsulant with a distance;
   a plurality of phosphor particles provided within the first encapsulant; and
   a second encapsulant, disposed on the carrier and encapsulating the LED chip, at least a portion of the second encapsulant is formed in the at least one opening of the first encapsulant.

16. The LED package structure according to claim 15, wherein the carrier comprises a metal leadframe, a pre-molded metal leadframe or a circuit substrate.

17. The LED package structure according to claim 15, wherein the LED chip has a first electrode and a second electrode both disposed on the top surface of the LED chip, while the first electrode and the second electrode are respectively electrically connected to the carrier via a first bonding wire and a second bonding wire.

* * * * *